United States Patent [19]

Marumoto et al.

[11] 4,207,478
[45] Jun. 10, 1980

[54] DC CHOPPER DEVICE

[75] Inventors: Katsuji Marumoto, Hitachi; Schigeru Kuriyama, Katsuta; Tsutomu Omae, Hitachi, all of Japan

[73] Assignee: Hitachi, Limited, Japan

[21] Appl. No.: 903,610

[22] Filed: May 8, 1978

[30] Foreign Application Priority Data

May 11, 1977 [JP] Japan ................................. 52-53179

[51] Int. Cl.² ...................... H03K 17/60; H03K 17/56
[52] U.S. Cl. ................................... 307/240; 307/242; 307/254; 318/341
[58] Field of Search ............... 307/240, 242, 254, 270; 318/341

[56] References Cited

U.S. PATENT DOCUMENTS

| 3,569,742 | 3/1971 | Schroeder | 307/254 |
| 3,803,471 | 4/1974 | Price et al. | 318/341 |
| 4,020,364 | 4/1977 | Kaijk | 307/242 |
| 4,118,641 | 10/1978 | Lannuzel | 307/240 |

Primary Examiner—John S. Heyman
Assistant Examiner—B. P. Davis
Attorney, Agent, or Firm—Craig and Antonelli

[57] ABSTRACT

A DC chopper device comprising a DC power source, a plurality of power transistors connected in series with a controlled unit driven by the DC power source and connected in parallel with each other to make chopping operation, a chopper control unit controlling the chopping operation of the power transistors, and a base drive circuit connected between the chopper control unit and each of the power transistors. Each base drive circuit includes impedance means for discharging the charge stored in the base region of the associated power transistor when the power transistor is turned off from its conducting state, and current flow blocking means for blocking current flow through the impedance means in the conducting state of the power transistor. The impedance values of the impedance means in the base drive circuits are selected so that all the power transistors can be substantially simultaneously turned on.

6 Claims, 16 Drawing Figures

DC CHOPPER DEVICE

LIST OF PRIOR ART REFERENCES (37 CFR 1.56 (a))

The following references are cited to show the state of the art:
(1) U.S. Pat. No. 3,699,358, Wilkinson, Oct. 17, 1972, 307/242
(2) U.S. Pat. No. 3,569,742, Schroeder, Mar. 9, 1971, 307/254
(3) U.S. Pat. No. 3,517,292, Thiele, June 23, 1970, 318/341
(4) U.S. Pat. No. 3,803,471, Price et al., Apr. 9, 1974, 318/341
(5) U.S. Pat. No. 3,571,623, Church et al., Mar. 23, 1971, 307/254
(6) Japanese Pat. Appln. Kokai (Laid-Open) No. 11056/74

BACKGROUND OF THE INVENTION

This invention relates to a DC chopper device, and more particularly to a transistor chopper device suitable for controlling a DC motor.

A DC chopper device is commonly employed in a system in which a DC power source such as a battery is used for the on-off control of a load. For example, in an electric vehicle, a DC chopper device is generally used for controlling a DC traction motor which drives the electric vehicle. There are a variety of types of DC chopper devices including the thyristor type and the transistor type.

These chopper devices are required to control a large electric power when used in, for example, electric vehicles, and therefore, elements constituting the chopper devices are also required to have a large capacity. Elements of large capacity are expensive compared with those of small capacity since such large-capacity elements are not mass-produced. Especially, the chopper device of the thyristor type is quite expensive since the chopper circuit has a complicated structure due to the necessity for incorporation of the commutation circuit.

Although transistor elements of large capacity are now available in the market, they are still more expensive than thyristors due to the low mass production rate. Thus, the high cost of semiconductor chopper elements of large capacity results inevitably in expensive chopper devices for use in electric vehicles. Efforts have heretofore been made to reduce the cost of DC chopper devices for use in electric vehicles, and such inexpensive DC chopper devices are disclosed in publications including U.S. Pat. Nos. 3,517,292, 3,569,742, 3,699,358 and 3,803,471, in which several or several tens of inexpensive power transistors of small capacity mass-produced for general application purposes are connected in parallel with each other to constitute chopper devices.

FIG. 1 shows a speed control system conventionally employed for controlling the speed of an electric vehicle by a DC chopper device comprising a plurality of parallel-connected power transistors. Referring to FIG. 1, the speed control system for controlling the speed of the electric vehicle comprises a battery B as a DC power source, a power supply on-off switch K, a series traction motor M having a series field winding FL, change-over switches $F_1$, $F_2$ and $R_1$, $R_2$ for changing over the polarity of the field winding FL to attain the change-over between the forward drive and the backward drive, a flywheel diode D, a transistor chopper TCH, a chopper control unit 10 controlling the transistor chopper TCH, and an accelerator unit 12 arranged for interlocking operation with the accelerator pedal of the electric vehicle for generating an electrical signal, in response to the depression of the accelerator pedal.

In operation, the power supply on-off switch K and the forward drive switches $F_1$, $F_2$ are turned on for the forward drive, and the output $V_{OSC}$ of the chopper control unit 10 is applied to the transistor chopper TCH for the on-off control of the transistor chopper TCH. The output $V_{OSC}$ of the chopper control unit 10 has a waveform as shown in FIG. 3. In the on state of the transistor chopper TCH, current is supplied from the battery B to the transistor chopper TCH by the route which is traced from the battery B→power supply switch K→forward drive switch $F_1$→series field winding FL→forward drive switch $F_2$→traction motor M to the transistor chopper TCH, thereby driving the traction motor M. In the off state of the transistor chopper TCH, flywheel current flows to the traction motor M through the flywheel diode D. The transistor chopper TCH repeats such an on-off operation. The ratio $\alpha=(T_1/T_1+T_2)$, where $T_1$ and $T_2$ are the conducting and non-conducting periods of time of the transistor chopper TCH respectively as shown in FIG. 3, and is varied according to the instruction provided by the accelerator unit 12 so as to attain the desired speed control of the traction motor M.

The circuitry of a prior art transistor chopper TCH comprising such a plurality of parallel-connected power transistors will be described with reference to FIG. 2. Referring to FIG. 2, a drive transistor $T_0$ is connected at its collector to a source of power supply voltage $V_{cc}$ in a control circuit through a collector resistor $R_{C0}$, at its emitter to a common terminal E of the control circuit, and at its base to a control signal input terminal through a base resistor $R_{10}$. The chopper control signal $V_{OSC}$ is applied to this control signal input terminal. A plurality of power transistors $T_1$ to $T_5$ which are driven by the drive transistor $T_0$ are connected at their emitters to the common terminal E through balancing emitter resistors $R_{E1}$ to $R_{E5}$ respectively and at their bases in parallel with the collector of the drive transistor $T_0$ through base resistors $R_{11}$ to $R_{15}$ respectively. The power transistors $T_1$ to $T_5$ are directly connected at their collectors to a terminal C connected to the traction motor M shown in FIG. 1, and the common terminal E, to which the emitters of the power transistors $T_1$ to $T_5$ are common-connected, is connected to the negative terminal of the battery B in FIG. 1 to constitute the chopper circuit.

In operation, the power transistors $T_1$ to $T_5$ are turned on in response to the application of the chopper control pulse $V_{OSC}$, having the waveform shown in FIG. 4, to the base of the drive transistor $T_0$. More precisely, when the chopper control pulse $V_{OSC}$ takes its low level as shown in FIG. 4, the drive transistor $T_0$ is turned off, and base current is supplied to the power transistors $T_1$ to $T_5$ through the collector resistor $R_{C0}$ for the drive transistor $T_0$ and through the base resistors $R_{11}$ to $R_{15}$ for the respective power transistors $T_1$ to $T_5$, with the result that collector currents $I_{C1}$ to $I_{C5}$ flow into the collectors of the respective power transistors $T_1$ to $T_5$. In the high level of the chopper control pulse $V_{OSC}$, the drive transistor $T_0$ is turned on to cut off all the power transistors $T_1$ to $T_5$.

FIG. 5 shows, by way of example, the waveforms of the collector currents $I_{C1}$ and $I_{C2}$ of the power transistors $T_1$ and $T_2$ among the power transistors $T_1$ to $T_5$ connected in parallel in the manner shown in FIG. 2. It will be seen from FIG. 5 that fluctuation of the turn-off characteristic of such power transistors results frequently in concentration of current flow on a specific power transistor in the transient state, and this specific power transistor may be damaged when the current value exceeds the current rating of the transistor. According to the prior art practice for dealing with this problem, power transistors having the same turn-off characteristic are selected for constituting the transistor chopper circuit. However, this method is impractical in that, because of the necessity for selection of power transistors having the same turn-off characteristic from among many transistors produced by mass production, a limited number of transistors only can be used for the purpose, resulting also in an increase in the cost of the transistors. According to another method proposed hitherto to deal with the above problem, power transistors having turn-off characteristics lying within an allowable range of fluctuation are selected to operate in a condition in which the operating current value is sufficiently lower than the maximum rating of each individual transistor, and the number of parallel-connected power transistors is increased to avoid objectionable concentration of current flow in a specific power transistor. However, this latter method requires a greater number of power transistors than the former method when the load current is the same, since the power transistors are used to operate with sufficient margins in their operating performance.

SUMMARY OF THE INVENTION

It is a primary object of the present invention to provide a novel and improved DC chopper device of the transistor type comprising a plurality of inexpensive small-capacity power transistors connected in parallel for controlling a large current, in which means are provided to ensure balanced uniform flow of collector currents in the power transistors without the objectionable concentration of collector current flow in a specific power transistor when turned off, so that each individual power transistor can operate with its maximum current rating, and the number of required power transistors can be minimized to reduce the cost of the chopper device.

The DC chopper device according to the present invention comprising a plurality of inexpensive small-capacity parallel-connected power transistors is featured by the fact that turn-on base currents of the same value are supplied to the individual power transistors in the turn-on stage, and turn-off base currents flowing in the turn-off stage are selected depending on the current amplification factor $h_{FE}$ of the individual power transistors to vary the turn-off time of the individual power transistors, so that the collector currents can be balanced in the turn-off stage, and the power transistors can individually bear a uniform collector current.

The above and other objects and the features of the present invention will become more apparent from the following detailed description of preferred embodiments thereof taken in conjunction with the accompanying drawings.

DETAILED DESCRIPTION OF THE PREFERRED EMBODIMENTS

Figure 1:
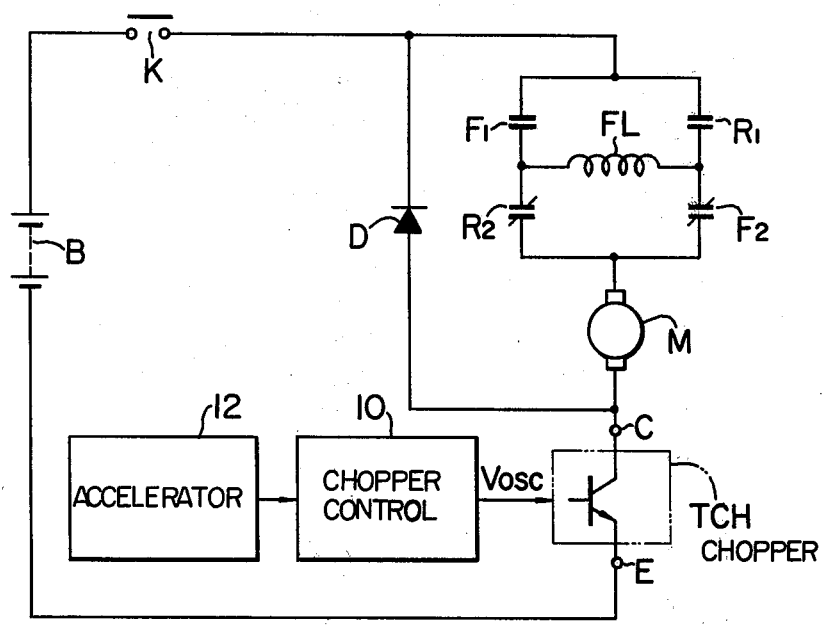
FIG. 1 is a block diagram showing a typical structure of a main circuit conventionally employed for controlling the speed of a traction motor driving an electric vehicle.
Figure 2:
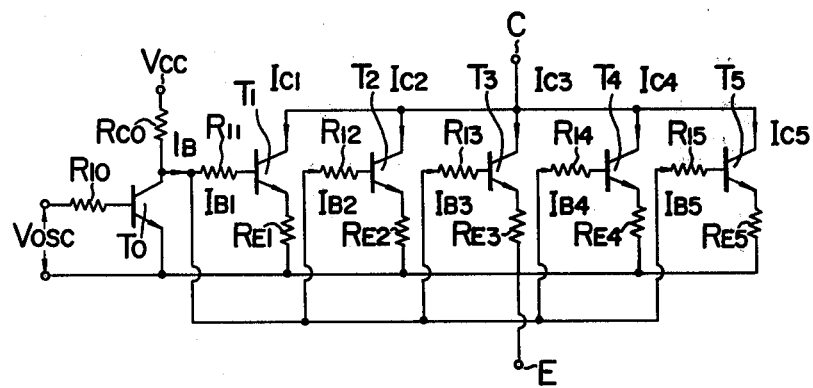
FIG. 2 is a circuit diagram of a known transistor chopper circuit used in the main circuit shown in FIG. 1.
Figure 3:
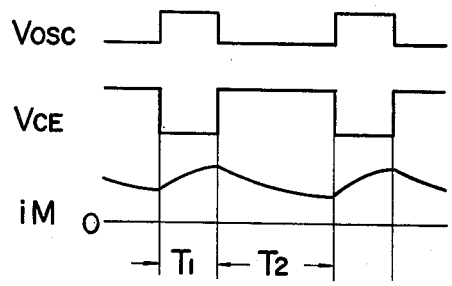
FIG. 3 is a waveform diagram illustrating the basic operating principle of the prior art transistor chopper circuit shown in FIG. 2.
Figure 4:
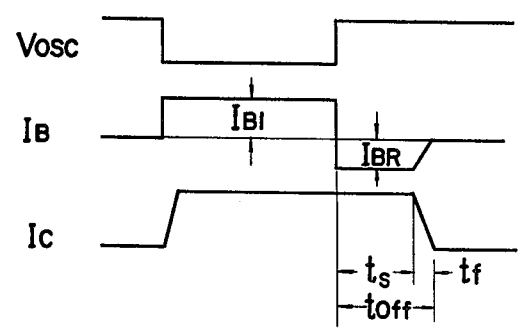
FIG. 4 is a time chart illustrating the relation between the input and the output of the power transistors constituting the prior art transistor chopper circuit shown in FIG. 2.
Figure 5:
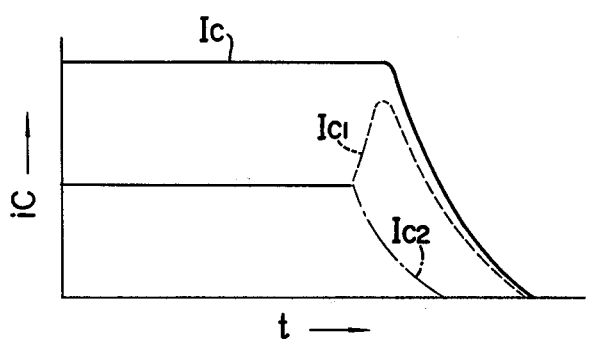
FIG. 5 is a waveform diagram of the collector currents of the power transistors constituting the prior art transistor chopper circuit shown in FIG. 2.
Figure 6:
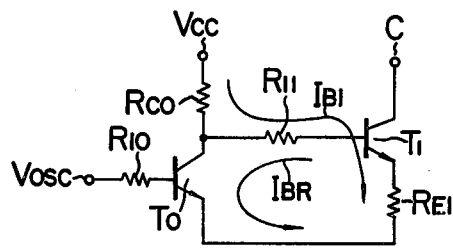
FIG. 6 is an enlarged circuit diagram of part of the prior art transistor chopper circuit shown in FIG. 2 to illustrate the flowing directions of base current in one of the power transistors in the turn-on and turn-off stages.

For a better understanding of the present invention, the operation of the prior art transistor chopper circuit shown in FIG. 2 will be described before describing the present invention in detail. FIG. 6 is an enlarged circuit diagram of the circuit portion including the drive transistor $T_0$ and one power transistor $T_1$ in FIG. 2. Referring to FIG. 6, the drive transistor $T_0$ is in its cut-off state when the chopper control pulse $V_{OSC}$ is in its low level. Therefore, the base current $I_{B1}$ is supplied from the source of power supply voltage $V_{cc}$ to the power transistor $T_1$ through the resistors $R_{C0}$ and $R_{11}$ to turn on the power transistor $T_1$. In this case, the power transistor $T_1$ is operating with saturated current, and excess minority carriers are stored in the portion of the base region adjacent the base-collector junction. Then, when the chopper control pulse $V_{OSC}$ turns into its high level from the low level as shown in FIG. 4, the drive transistor $T_0$ is now turned on. Since, at this time, the excess minority carriers are stored in the base region of the power transistor $T_1$, this power transistor $T_1$ is not instantaneously cut off and is cut off with a delay time. This delay time is called the turn-off time $t_{off}$ and is expressed as $$t_{off} = t_s + t_f \tag{1}$$

where $t_s$ is the storage time representing the period of time required for complete discharge of the charge stored in the base region, and $t_f$ is the so-called fall time. Generally, the storage time $t_s$ is longer than the fall time $t_f$, and this storage time $t_s$ fluctuates greatly between power transistors of the same kind, whereas the fall time $t_f$ fluctuates within a relatively narrow range. Therefore, the storage time $t_s$ is the factor which exerts a very great influence on the turn-off characteristics of the power transistors.

When the drive transistor $T_0$ is turned on, the charge stored in the base region of the power transistor $T_1$ produces a discharge current $I_{BR}$ which flows through the resistor $R_{11}$ and drive transistor $T_0$. The flow of this discharge current or turn-off base current $I_{BR}$ decreases the storage time $t_s$. It is known that the storage time $t_s$ is generally given by the following equation:

$$t_s = \tau_x \frac{I_{B1} - I_C/h_{FE}}{(\frac{I_{B1} + I_C/h_{FE}}{2} - I_{BR})} \tag{2}$$

where $I_{B1}$, $I_{BR}$, $I_C$, $h_{FE}$ and $\tau_x$ are the turn-on base current, the turn-off base current, the collector current, the current amplification factor, and a proportional constant respectively.

It will be seen from the equation (2) that, when the collector current $I_C$ is constant, the storage time $t_s$ varies depending on the turn-on base current $I_{B1}$ and turn-off base current $I_{BR}$ and also depending on the current amplification factor $h_{FE}$. The turn-on base current $I_{B1}$ must be maintained constant in order that the collector currents of the individual power transistors can be balanced in the steady state. The current amplification factor $h_{FE}$ varies greatly depending on the individual power transistors, resulting in corresponding great variations of the storage time $t_s$. Thus, when the turn-off base current $I_{BR}$ is adjusted for each individual power transistor under the condition of the constant turn-on base current $I_{B1}$ in order to eliminate the influence of the current amplification factor $h_{FE}$, the storage time $t_s$ for each individual power transistor can be varied so as to establish a balance between the collector current values in the turn-off stage of the power transistors.

Figure 7:
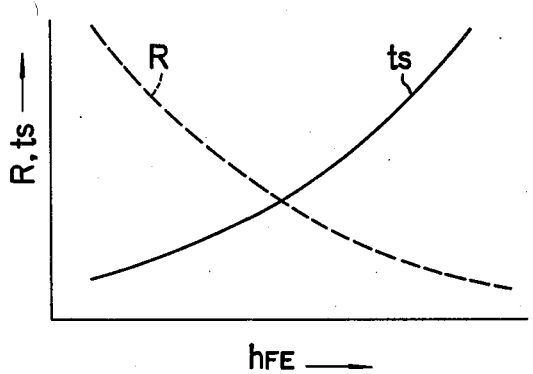
FIG. 7 is a graph showing the relation between the current amplification factor $h_{FE}$ of the power transistor, the storage time $t_s$ and the required impedance $R_Z$.

FIG. 7 shows the relation between the current amplification factor $h_{FE}$ and the storage time $t_s$ when the collector current $I_C$ and base currents $I_{B1}$, $I_{BR}$ in the equation (2) are maintained constant. It will be understood from FIG. 7 that the storage time $t_s$ of a power transistor increases with the increase in the current amplification factor $h_{FE}$ of that power transistor. Therefore, in order to compensate the fluctuation of the storage time $t_s$ due to the fluctuation of the current amplification factor $h_{FE}$ of the power transistors $T_1$ to $T_5$ in FIG. 2, the resistance values of the base resistors $R_{11}$ to $R_{15}$ for the respective power transistors $T_1$ to $T_5$ may be selected to be inversely proportional to the values of the current amplification factor $h_{FE}$ of the corresponding power transistors. That is, such resistance values may be selected as shown by the broken curve in FIG. 7.

The turn-on base current $I_{B1}$ is expressed as follows:

$$I_{B1} = \frac{V_{CC} - (V_{BE} + R_{E1} \cdot I_E)}{R_{11} + R_{10}} \tag{3}$$

where $V_{CC}$, $V_{BE}$, $I_E$, $R_{E1}$, $R_{11}$ and $R_{10}$ are the power supply voltage, the base-emitter voltage, the emitter current, the resistance of the emitter resistor, and the resistance of the collector resistor, respectively. Since the relations $V_{CC} >> V_{BE}$ and $V_{CC} >> R_{E1} \cdot I_E$ hold generally, it may be concluded that the value of the turn-on base current $I_{B1}$ is determined by the values of the collector resistor $R_{C0}$ and base resistor $R_{11}$. It is therefore extremely difficult to set the storage time $t_s$ at the required value since the variation of the value of the base resistor $R_{11}$ for the purpose of adjusting the storage time $t_s$ results inevitably in a corresponding variation of the value of the turn-on base current $I_{B1}$.

Figure 8:
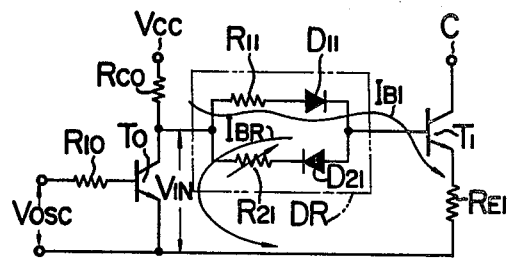
FIG. 8 is a circuit diagram similar to FIG. 6, but illustrating the basic principle of the chopper device according to the present invention.

FIG. 8 is a circuit diagram similar to FIG. 6, but illustrating the basic operating principle of the chopper device of the present invention which obviates the prior art defects. Referring to FIG. 8 in which the same reference numerals are used to denote the same parts appearing in FIG. 6, a base drive circuit DR is connected between the collector of the drive transistor $T_0$ and the base of the power transistor $T_1$ and comprises a pair of diodes $D_{11}$, $D_{21}$ and an impedance-adjusting variable resistor $R_{21}$ in addition to the base resistor $R_{11}$. The impedance-adjusting variable resistor $R_{21}$ is connected in parallel with the base resistor $R_{11}$, and the diode $D_{11}$ is connected in series with the base resistor $R_{11}$ with its cathode connected to the base of the power transistor $T_1$, while the diode $D_{21}$ is connected in series with the variable resistor $R_{21}$ with its anode connected to the base of the power transistor $T_1$.

Figure 9:
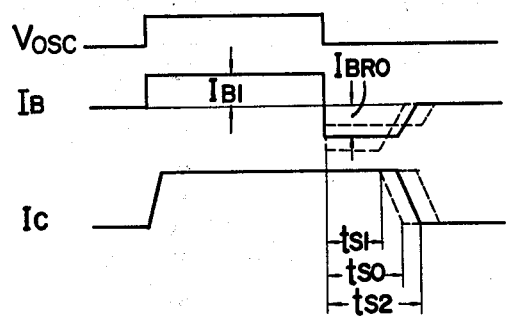
FIG. 9 is a time chart illustrating the basic operating principle of the chopper device according to the present invention.

The operation of the circuit having a structure as shown in FIG. 8 will now be described. When the drive transistor $T_0$ is turned off to turn on the power transistor $T_1$, a constant turn-on base current $I_{B1}$ as shown in FIG. 9 flows to the base of the power transistor $T_1$ through the resistors $R_{C0}$, $R_{11}$ and diode $D_{11}$, while when the drive transistor $T_0$ is turned on to turn off the power transistor $T_0$, the charge stored in the base region of the power transistor $T_1$ discharges through the diode $D_{21}$, variable resistor $R_{21}$ and drive transistor $T_0$ to produce a turn-off base current $I_{BR}$. It will be seen from FIG. 9 that the storage time $t_s$ for each individual power transistor can be varied as, for example, shown by $t_{s1}$, $t_{s2}$ and $t_{s3}$ by suitably adjusting the variable resistor $R_{21}$ depending on the current amplification factor $h_{FE}$ of each individual power transistor thereby varying the value of the discharge current or turn-off base current $I_{BR}$.

It will thus be seen that, according to the basic principle of the present invention, the constant turn-on base current is supplied in the turn-on stage of each of the power transistors, and the setting of the variable resistors is adjusted depending on the current amplification factor $h_{FE}$ of the individual power transistors to vary the turn-off base current thereof in the turn-off stage, so that the turn-off time $t_{off}$ of each individual power transistor can be suitably adjusted.

Figure 11:
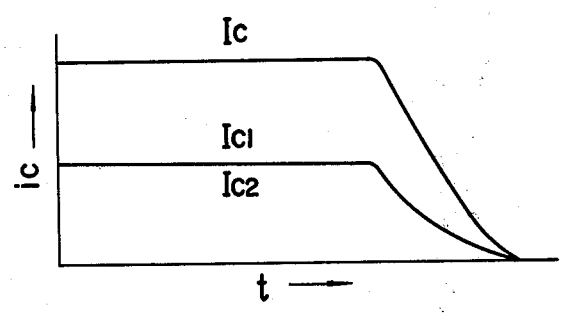
FIG. 11 is a waveform diagram of the collector currents of the power transistors in the chopper device of the present invention shown in FIG. 10.
Figure 10:
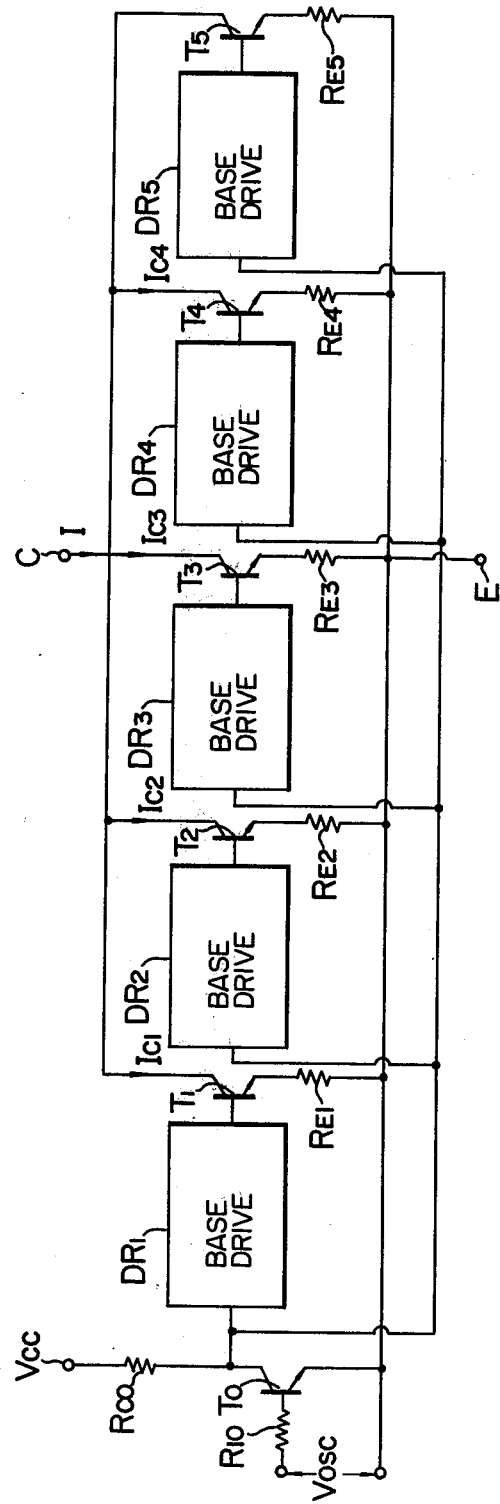
FIG. 10 is a circuit diagram showing the structure of an embodiment of the chopper device of the present invention constructed according to the basic principle illustrated in FIG. 8.

FIG. 10 shows a chopper circuit comprising a plurality of parallel-connected power transistors each of which is provided with a base circuit based on the basic principle of the present invention described with reference to FIG. 8. No detailed description of the structure of the chopper circuit shown in FIG. 10 will be given herein since the structure is generally similar to that of the prior art circuit shown in FIG. 2, except for the provision of the base drive circuits $DR_1$ to $DR_5$. As an example of the operation of the chopper circuit shown in FIG. 10, FIG. 11 shows the waveforms of the collector currents $I_{C1}$ and $I_{C2}$ of the power transistors $T_1$ and $T_2$ respectively relative to the waveform of the composite current $I_C$. This FIG. 11 illustrates the fact that the collector currents of all the power transistors are completely balanced without the objectionable current flow concentration on a single power transistor.

The application of the above-described basic circuitry to a transistor chopper device comprising a plurality of parallel-connected power transistors is advantageous in that the power transistors can operate with the same turn-off characteristic, and by virtue of the uniform distribution of the turn-off base currents of the power transistors, the problem of objectionable current flow concentration on a specific power transistor can be obviated. In the prior art transistor chopper circuit, the power transistors have been adapted to operate with a current value sufficiently lower than the maximum rating taking into account the unbalance of the collector currents, and the number of the power transistors has been increased so that they can operate with sufficient margins in their operating performance. Therefore, the present invention is advantageous in that each individual power transistor can operate with its maximum rating of the operating performance, and hence, the total number of the power transistors can be decreased.

Figure 12:
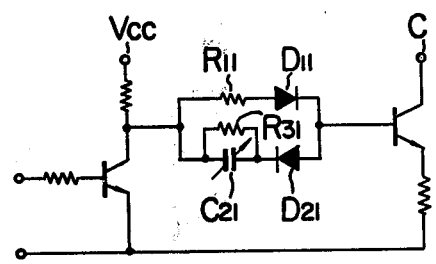
FIG. 12 is a circuit diagram showing the structure of part of another embodiment of the present invention.
Figure 13:
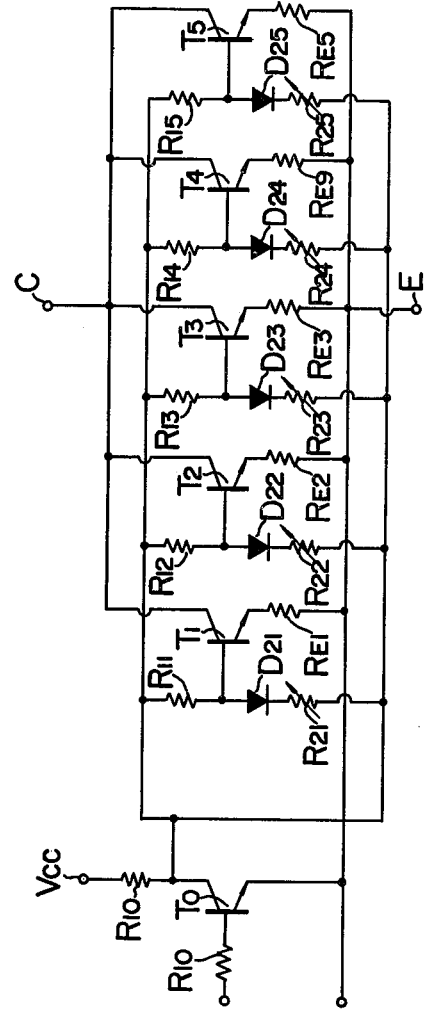
FIG. 13 is a circuit diagram showing the structure of still another embodiment of the present invention.

FIG. 12 shows a modification of the circuit shown in FIG. 8. The circuit shown in FIG. 12 differs from that shown in FIG. 8 in that the variable resistor $R_{21}$ used in FIG. 8 for varying the base impedance is replaced by the combination of a variable capacitor C and a leak resistor $R_{31}$. It is apparent that the circuit shown in FIG. 12 is as effective as that shown in FIG. 8. Further, when the relation between the base resistor $R_{11}$ and the discharge resistor $R_{21}$ in FIG. 8 is given by $R_{11} \gg R_{21}$, the diode $D_{11}$ can be eliminated, and in such a case, the structure of the chopper device can be simplified as shown in FIG. 13.

In FIG. 8, the variable discharge resistor $R_{21}$ is used to vary the turn-off base current $I_{BR}$ of the power transistor $T_1$, and the chopper device shown in FIG. 10 includes such variable discharge resistors $R_{21}$ to $R_{25}$. However, when, for example, such discharge resistors are printed on a substrate of a printed circuit board which provides the chopper device, a portion of these resistors may be suitably trimmed or otherwise removed in the course of the assembling of the chopper device so as to adjust the resistance values of these resistors. Elimination of the moving parts of these resistors can improve the reliability of the chopper device and can also facilitate the production of the chopper device.

Figure 14:
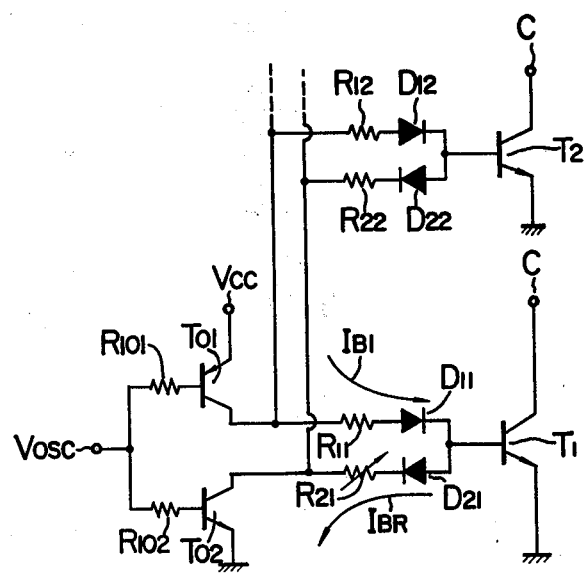
FIG. 14 is a circuit diagram showing the structure of part of yet another embodiment of the present invention.

FIG. 14 is a circuit diagram of part of another embodiment of the present invention. Referring to FIG. 14, a turn-on drive transistor $T_{01}$ and a turn-off drive transistor $T_{02}$ are provided to drive a power transistor $T_1$, and a chopper control pulse $V_{OSC}$ is applied to the bases of these transistors $T_{01}$ and $T_{02}$ through base resistors $R_{101}$ and $R_{102}$ respectively. The turn-on drive transistor $T_{01}$ is connected at its collector to the base of the power transistor $T_1$ through a base resistor $R_{11}$ and a diode $D_{11}$. Similarly, the turn-off drive transistor $T_{02}$ is connected at its collector to the base of the power transistor $T_1$ through a variable resistor or turn-off base resistor $R_{21}$ and a diode $D_{21}$. The turn-on drive transistor $T_{01}$ is connected at its emitter to a source of power supply voltage $V_{CC}$, while the turn-off drive transistor $T_{02}$ is connected at its emitter to ground.

In operation, when the chopper control pulse $V_{OSC}$ takes its low level, the source of power supply voltage $V_{CC}$ provides the base current which is supplied to the base of the turn-on drive transistor $T_{01}$ through the base resistor $R_{101}$ to turn on the drive transistor $T_{01}$. As a consequence, the turn-on base current $I_{B1}$ is supplied to the base of the power transistor $T_1$ through the resistor $R_{11}$ and diode $D_{11}$ to turn on the power transistor $T_1$. At this time, the turn-off drive transistor $T_{02}$ remains in the cut-off state, and the turn-off base current $I_{BR}$ does not flow.

Then, when the chopper control pulse $V_{OSC}$ takes its high level, the turn-on drive transistor $T_{01}$ is turned off to cease the flow of the turn-on base current $I_{B1}$, and the turn-off drive transistor $T_{02}$ is turned on in turn.

Thus, by the provision of the drive transistors $T_{01}$ and $T_{02}$ turned on and off alternately, the turn-on base current $I_{B1}$ for turning on the power transistor $T_1$ flows entirely to the base of the power transistor $T_1$, and the turn-off base current $I_{BR}$ flows out from the power transistor $T_1$ by the discharge of the charge stored in the base region of the power transistor $T_1$ when this transistor $T_1$ is turned off. Therefore, the value of the turn-off base current $I_{BR}$ can be adjusted by merely adjusting the variable resistor $R_{21}$ in the cut-off state of the power transistor $T_1$.

The value of the turn-on base current $I_{B1}$ required for turning on the power transistor $T_1$ can be determined independently of the turn-off operation by merely suitably selecting the value of the base resistor $R_{11}$. Other power transistors $T_2$ to $T_5$ are also connected to the collectors of the drive transistors $T_{01}$ and $T_{02}$ in a manner as shown in FIG. 14.

In the on-off operation of the drive transistors $T_{01}$ and $T_{02}$ shown in FIG. 14, the durations of switching operation of the drive transistors $T_{01}$ and $T_{02}$ may not be equal to each other due to the factors including possible fluctuation of the operating characteristic of these elements, and pulse leakage or like trouble may result. Such a problem can be solved by employing a modified circuit as shown in FIG. 15.

Figure 15:
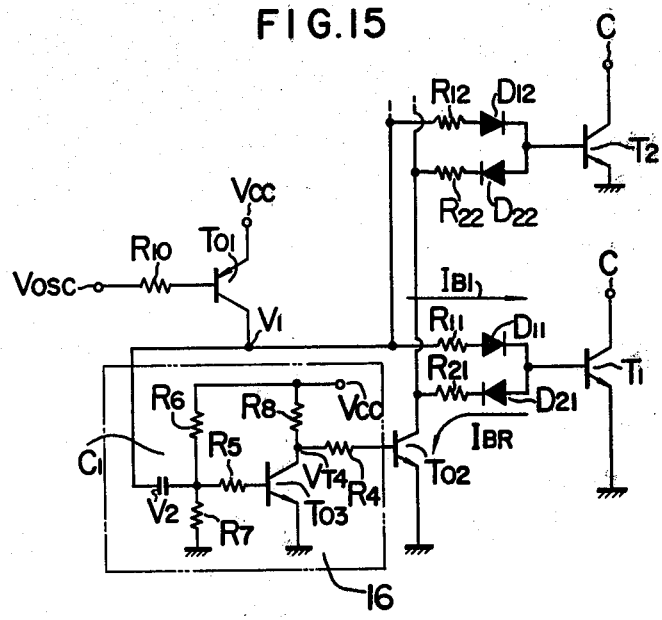
FIG. 15 is a circuit diagram showing the structure of part of a further embodiment of the present invention.
Figure 16:
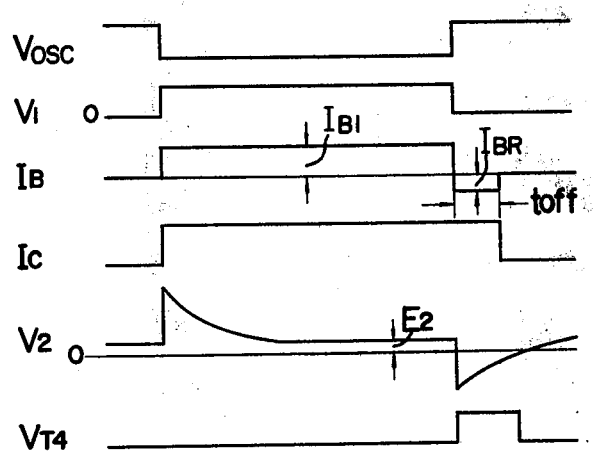
FIG. 16 is a time chart illustrating the operation of the circuit shown in FIG. 15.

The modification shown in FIG. 15 differs from the circuit shown in FIG. 14 in that a differential signal generating circuit 16 is additionally provided. Referring to FIG. 15, this differential signal generating circuit 16 includes a differentiating capacitor $C_1$, voltage-dividing resistors $R_6$, $R_7$, a differentiated signal amplifying transistor $T_{03}$, and a base resistor $R_5$ and a collector resistor $R_8$ for the transistor $T_{03}$. The operation of the differential signal generating circuit 16 will be described with reference to a time chart of operating waveforms shown in FIG. 16. When the chopper control pulse $V_{OSC}$ is in its high level, the drive transistor $T_{01}$ is in its cut-off state. Thus, the drive transistor $T_{01}$ provides an output voltage $V_1$ of zero level, and the turn-on base current $I_{B1}$ is also zero as shown in FIG. 16. In this case, the voltage-dividing resistors $R_6$ and $R_7$ in the differential signal generating circuit 16 provide a voltage $V_2$ having a level of $E_2$, and the base current is supplied to the transistor $T_{03}$ through the base resistor $R_5$ to turn on the transistor $T_{03}$. Then, when the chopper control pulse $V_{OSC}$ takes its low level, the drive transistor $T_{01}$ is turned on to supply the turn-on base current $I_{B1}$ to the power transistor $T_1$ to turn on the same. In this case, the voltage $V_2$ obtained by differentiating the voltage $V_1$ has a positive value and remains in that level since the transistor $T_{03}$ has already been turned on.

Then, when the chopper control pulse $V_{OSC}$ takes its high level again, the drive transistor $T_{01}$ is cut off to provide zero turn-on base current $I_{B1}$. At the same time, the differentiated voltage signal $V_2$ of negative value is generated at the fall time of the voltage $V_1$, and the transistor $T_{03}$ is turned off from its conducting state to turn on the drive transistor $T_{02}$. The charge stored in the base region of the power transistor $T_1$ discharges through the diode $D_{21}$, variable resistor $R_{21}$ and drive transistor $T_{02}$ to produce the turn-off base current $I_{BR}$. The flowing duration of this current $I_{BR}$ is the turn-off time $t_{off}$ of the power transistor $T_1$, and this turn-off time $t_{off}$ can be easily varied by varying the value of the variable resistor $R_{21}$. The differentiated voltage signal $V_2$ of negative value must last during such a period of time which is long enough to maintain the drive transistor $T_{02}$ in its conducting state over a period of time sufficiently longer than the turn-off time $t_{off}$. The value of the current supplied to the base of the transistor $T_{03}$ through the capacitor $C_1$ and base resistor $R_5$ may be sufficiently smaller than that of the turn-on base current $I_{B1}$ of the power transistor $T_1$ since this current is amplified by the transistor $T_{03}$. Therefore, transistors capable of handling only a small signal may be sufficiently used as the transistors $T_{02}$ and $T_{03}$.

It will thus be seen that, in the modification shown in FIG. 15, the differential signal generated in synchronism with the turn-off of the turn-on drive transistor $T_{01}$ is utilized to turn on the turn-off drive transistor $T_{02}$. Therefore, the drive transistors $T_{01}$ and $T_{02}$ can make satisfactory switching operation without being affected by the factors including the difference between the turn-on operation time and the turn-off operation time.

It will be understood from the foregoing detailed description of the present invention that a transistor chopper device of large capacity can be constituted by a plurality of inexpensive power transistors of small capacity, and the transistor chopper device thus obtained is very inexpensive compared with that including a single power transistor of very large capacity.

Further, uniform distribution of currents handled by the individual power transistors improves the utility factor of the transistors. Therefore, the cost of the chopper device of the present invention is considerably less than that of prior art chopper devices of the same capacity since the number of required elements can be decreased.

While the transistor chopper device of the present invention has been described with reference to its application to a speed control system for an electric vehicle by way of example, it is apparent that the present invention is equally effectively applicable to all kinds of control systems in which the control power source is of the DC type, and the voltage applied to the load is intermittently controlled.

We claim:

1. A DC chopper device comprising a DC power source, a plurality of power transistors connected in series with a controlled unit driven by said DC power source, said power transistors being connected in parallel with each other for individually making the chopping operation, chopper control means for controlling the chopping operation of said power transistors, and base drive circuit means connected between said chopper control means and the bases of said power transistors, wherein said base drive circuit means comprises:
   (1) a plurality of first impedance means for determining the values of turn-on base currents supplied to said power transistors so as to provide substantially equal collector currents for said power transistors in the turn-on state of said power transistors;
   (2) a plurality of second impedance means for determining the values of turn-off base currents so as to substantially simultaneously turn off said power transistors in response to the cessation of supply of the turn-on base currents to said power transistors; and
   (3) current flow blocking means for blocking current flow through said second impedance means while the turn-on base currents are being supplied to the bases of said power transistors through said first impedance means respectively.

2. A DC chopper device as claimed in claim 1, wherein the relation between the impedance value of each of said second impedance means and the current amplification factor of the associated one of said power transistors is such that the former value decreases in proportion to the increase in the latter value.

3. A DC chopper device as claimed in claim 1 or 2, wherein said current flow blocking means comprises a plurality of diodes connected in series with said second impedance means respectively.

4. A DC chopper device as claimed in claim 1, 2 or 3, wherein a plurality of diodes are connected in the forward direction in series with said first impedance means respectively to permit flow of the turn-on base currents to said power transistors.

5. A DC chopper device as claimed in claim 1 or 2, wherein said current flow blocking means comprises:
   (1) a turn-on drive transistor for supplying the turn-on base current to each of said power transistors through the associated one of said first impedance means; and
   (2) a turn-off drive transistor making switching operation opposite to that of said turn-on drive transistor for discharging the charge stored in the base region of each of said power transistors through the associated one of said second impedance means.

6. A DC chopper device as claimed in claim 5, wherein said current flow blocking means further comprises a circuit including means for differentiating the output signal of said turn-on drive transistor, said differential signal being used to turn on said turn-off drive transistor upon turn-off of said turn-on drive transistor and to maintain said turn-off drive transistor in the conducting stage during a period of time sufficiently longer than the storage time of each of said power transistors.

* * * * *